(12) United States Patent
Lee et al.

(10) Patent No.: US 8,357,605 B2
(45) Date of Patent: Jan. 22, 2013

(54) METHODS OF FABRICATING SEMICONDUCTOR MEMORY DEVICES

(75) Inventors: Jong-Min Lee, Ulsan (KR); Jae-Kwan Park, Suwon-si (KR); Jee-Hoon Han, Hwaseong-si (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 13/190,032

(22) Filed: Jul. 25, 2011

(65) Prior Publication Data

US 2012/0052676 A1 Mar. 1, 2012

(30) Foreign Application Priority Data

Aug. 25, 2010 (KR) .................. 10-2010-0082475

(51) Int. Cl.
*H01L 21/3205* (2006.01)
*H01L 21/4763* (2006.01)

(52) U.S. Cl. . 438/592; 438/257; 438/264; 257/E21.179; 257/E29.3

(58) Field of Classification Search .................. 438/592; 257/E21.179
See application file for complete search history.

(56) References Cited

U.S. PATENT DOCUMENTS

2009/0096007 A1* 4/2009 Omura et al. ................. 257/316
2009/0325371 A1* 12/2009 Kim et al. ..................... 438/588

FOREIGN PATENT DOCUMENTS

| JP | 2001-168059 | 6/2001 |
|---|---|---|
| JP | 2008-098504 | 4/2008 |
| KR | 1020020048273 | 6/2002 |

\* cited by examiner

*Primary Examiner* — Michelle Mandala
*Assistant Examiner* — Shaka White
(74) *Attorney, Agent, or Firm* — Myers Bigel Sibley & Sajovec, P.A.

(57) ABSTRACT

Methods of forming memory devices are provided. The methods may include forming a pre-stacked gate structure including a lower structure and a first polysilicon pattern on the substrate. The methods may also include forming an insulation layer covering the pre-stacked gate structure. The methods may further include forming a trench in the insulation layer by removing a portion of the first polysilicon pattern. The methods may additionally include forming a metal film pattern in the trench on the first polysilicon pattern. The methods may also include forming a first metal silicide pattern by performing a first thermal treatment on the first polysilicon pattern and the metal film pattern. The methods may further include forming a second polysilicon pattern in the trench. The methods may additionally include forming a second metal silicide pattern by performing a second thermal treatment on the second polysilicon pattern and the first metal silicide pattern.

20 Claims, 15 Drawing Sheets

US 8,357,605 B2

METHODS OF FABRICATING SEMICONDUCTOR MEMORY DEVICES

CROSS-REFERENCE TO RELATED APPLICATION

This U.S. non-provisional patent application claims priority under 35 U.S.C. §119 to Korean Patent Application No. 10-2010-0082475, filed on Aug. 25, 2010, the disclosure of which is hereby incorporated by reference in its entirety.

BACKGROUND

The present disclosure relates to methods of fabricating memory devices.

Memory devices may include non-volatile memory devices. Non-volatile memory integrated circuit devices can retain stored data even after the supply of power has been interrupted. As such, non-volatile memory integrated circuit devices have been widely used in information communication devices, such as, for example, digital cameras, mobile phones, Personal Digital Assistants (PDAs), and Moving Picture Experts Group (MPEG) Audio Layer 3 (MP3) players.

However, higher capacity and higher integration for non-volatile memory integrated circuit devices may be desired as information communication devices move more and more toward having expanded multi-functions. Accordingly, the size of each memory cell constituting a non-volatile semiconductor integrated circuit device has rapidly decreased. With the decrease in memory cell size, word line width has also decreased, thereby increasing electrical resistance. For example, a necking phenomenon may occur in which an area of a metal silicide pattern is reduced when the metal silicide pattern is formed. The reduced area of the metal silicide pattern may increase electrical resistance. Moreover, the increased electrical resistance of the word line may also increase the Resistance-Capacitance (RC) delay of the word line in a read operation. As a result, the time consumed reading information from a selected cell, that is, the access time, may also increase, and information analysis capability (e.g., one-shot distribution) may be reduced accordingly.

SUMMARY

Embodiments of the inventive concept may provide methods of fabricating memory devices, and the methods may include forming a pre-stacked gate structure on a substrate. The pre-stacked gate structure may include a lower structure and a first polysilicon pattern on the lower structure. The methods may also include forming an insulation layer covering the pre-stacked gate structure. The methods may further include forming a trench in the insulation layer, and forming a partially-removed first polysilicon pattern, by removing a portion of the first polysilicon pattern. The methods may additionally include forming a metal film pattern in the trench on the partially-removed first polysilicon pattern. The methods may also include forming a first metal silicide pattern by performing a first thermal treatment on the partially-removed first polysilicon pattern and the metal film pattern. The methods may further include forming a second polysilicon pattern in the trench. The methods may additionally include forming a second metal silicide pattern by performing a second thermal treatment on the second polysilicon pattern and the first metal silicide pattern.

In some embodiments, forming the second polysilicon pattern may include forming a polysilicon layer on the insulation layer and filling the trench. Forming the second polysilicon pattern may also include removing a portion of the polysilicon layer to expose a top surface of the insulation layer.

In some embodiments, the lower structure may include a first dielectric layer pattern, a charge storage layer pattern, and a second dielectric layer pattern that are sequentially stacked.

In some embodiments, forming the trench may include removing a portion of the insulation layer such that a width of the trench increases toward a top surface of the insulation layer.

In some embodiments, a width of the second polysilicon pattern may increase toward the top surface of the insulation layer.

In some embodiments, the metal film pattern may be conformally formed on an inner wall of the trench and on the partially-removed first polysilicon pattern and the insulation layer.

In some embodiments, the methods may further include, after the first thermal treatment, substantially removing the insulation layer and portions of the metal film pattern remaining on the inner wall of the trench.

In some embodiments, the metal film pattern may include at least one of cobalt (Co), tungsten (W), molybdenum (Mo), titanium (Ti), and tantalum (Ta).

In some embodiments, the first metal silicide pattern may include at least one of cobalt silicide (CoSi), tungsten silicide (WSi), molybdenum silicide (MoSi), titanium silicide (TiSi), and tantalum silicide (TaSi).

In some embodiments, the methods may further include forming a polysilicon pattern between the second metal silicide pattern and the lower structure.

According to some embodiments, methods of fabricating memory devices may include forming first and second pre-stacked gate structures on a substrate, each of the first and second pre-stacked gate structures including a lower structure and a first polysilicon pattern on the lower structure. The methods may also include forming a first insulation layer covering the first and second pre-stacked gate structures. The methods may further include forming a trench in the first insulation layer by removing a portion of the first polysilicon pattern. The methods may additionally include forming a metal film pattern in the trench on the first polysilicon pattern. The methods may also include forming a first metal silicide pattern by performing a first thermal treatment on the first polysilicon pattern and the metal film pattern. The methods may further include forming a second polysilicon pattern in the trench. The methods may additionally include forming first and second stacked gate structures by forming a second metal silicide pattern by performing a second thermal treatment on the second polysilicon pattern and the first metal silicide pattern. The methods may also include forming a gap between the first and second stacked gate structures.

In some embodiments, forming the gap may include substantially removing the first insulation layer between the first and second stacked gate structures.

In some embodiments, the methods may further include, after substantially removing the first insulation layer, forming a second insulation layer covering sidewalls of the first and second stacked gate structures.

In some embodiments, the gap between the first and second stacked gate structures may be free of the second insulation layer.

In some embodiments, the second insulation layer may surround the gap.

According to some embodiments, methods of forming memory devices may include forming a first polysilicon pattern on a charge storage pattern and at least one dielectric pattern. The methods may also include forming an insulation layer on sidewalls of the first polysilicon pattern, the charge storage pattern, and the at least one dielectric pattern. The methods may further include forming a trench in the insulation layer, and forming a partially-removed first polysilicon pattern, by removing a portion of the first polysilicon pattern and removing a portion of the insulation layer. The methods may additionally include forming a metal film pattern in the trench on the partially-removed first polysilicon pattern. The methods may also include forming a first metal silicide pattern by performing a first thermal treatment on the partially-removed first polysilicon pattern and the metal film pattern. The methods may further include forming a second polysilicon pattern on the first metal silicide pattern in the trench. The methods may additionally include forming a second metal silicide pattern by performing a second thermal treatment on the second polysilicon pattern and the first metal silicide pattern.

In some embodiments, the at least one dielectric pattern may include two dielectric patterns, and the charge storage pattern may be between the two dielectric patterns.

In some embodiments, removing a portion of the insulation layer may include removing the portion of the insulation layer such that a width of the trench increases toward a top surface of the insulation layer.

In some embodiments, a width of the second metal silicide pattern may be greater than a width of the first metal silicide pattern.

In some embodiments, the methods may further include forming a gap between first and second ones of the charge storage patterns. Also, an additional insulation layer may be formed between the gap and the first and second ones of the charge storage patterns.

BRIEF DESCRIPTION OF THE DRAWINGS

The above and other features and advantages of the disclosure will become more apparent by describing in detail example embodiments thereof with reference to the attached drawings in which.

DETAILED DESCRIPTION

Figure 1:
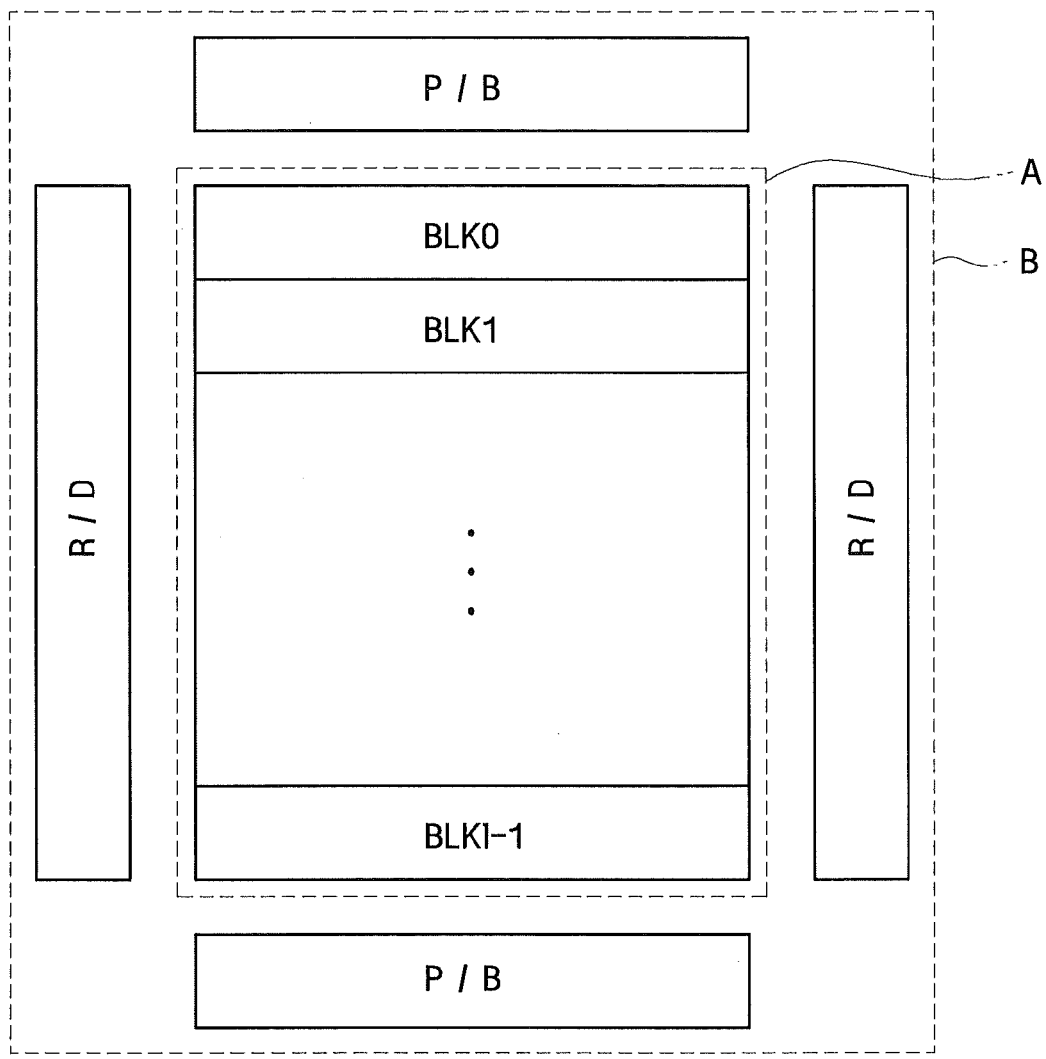
FIG. 1 is a block diagram of a NAND-type non-volatile memory integrated circuit device to which transistor structures according to some embodiments may be applied.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
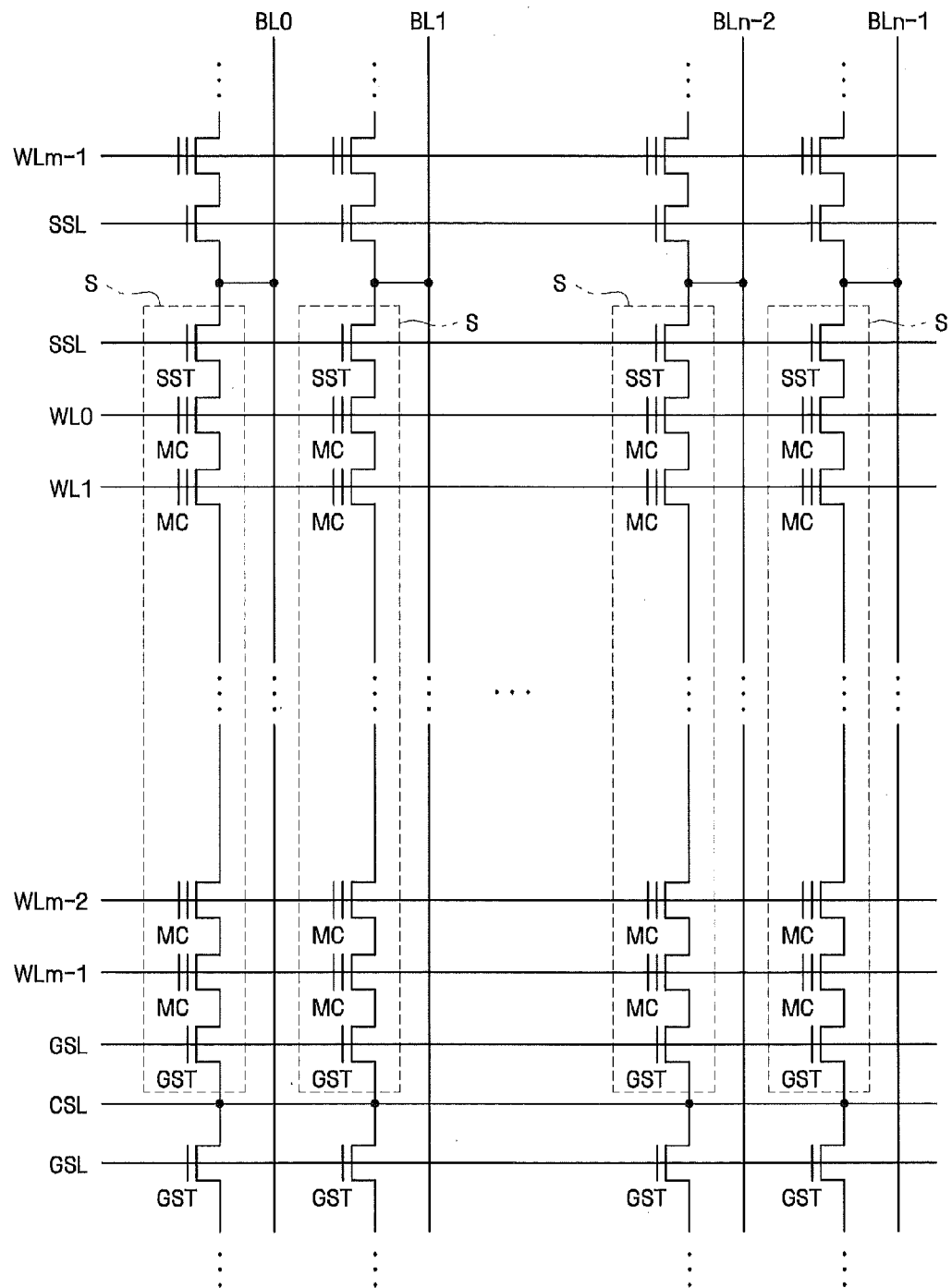
FIG. 2 is a circuit diagram showing the cell array region of FIG. 1.

FIG. 1 is a block diagram of a NAND-type non-volatile memory integrated circuit device to which transistor structures according to some embodiments are applied. FIG. 2 is a circuit diagram showing the cell array region of FIG. 1, and FIG. 3 is a diagram showing the layout of the cell array region of FIG. 1.

Figure 3:
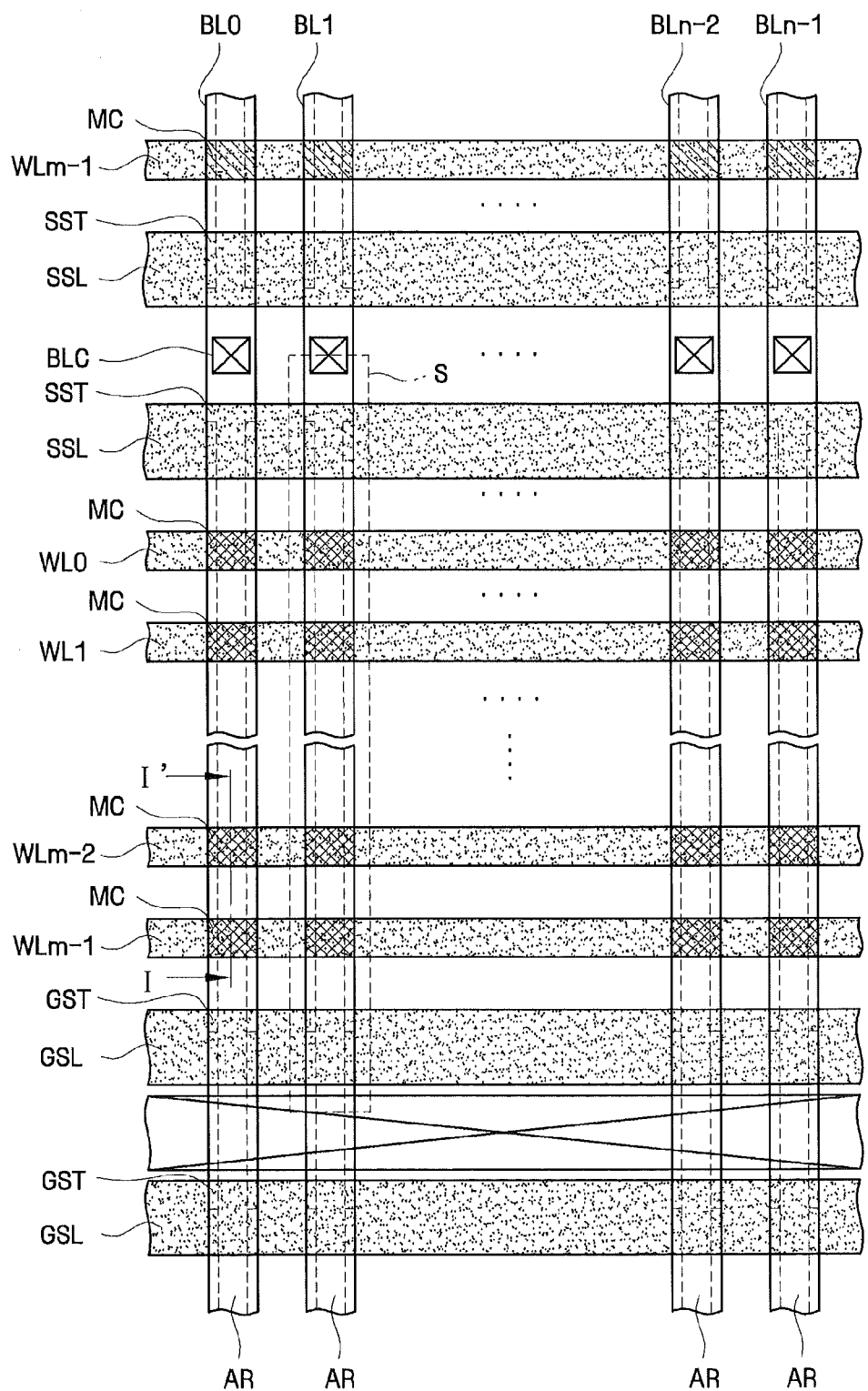
FIG. 3 is a diagram showing the layout of the cell array region of FIG. 1.

Referring to FIGS. 1 to 3, in the cell array region A of a NAND-type non-volatile memory integrated circuit device, a plurality of cell blocks BLK0 to BLK1-1 may be repeatedly arranged. A plurality of active regions AR may be arranged in each of the cell blocks BLK0 to BLK1-1. String selection lines SSL, ground selection lines GSL, and common source lines CSL are arranged to be perpendicular to the active regions AR. A plurality of word lines WL0 to WLm-1 are arranged between a string selection line SSL and a ground selection line GSL. Further, a plurality of bit lines BL0 to BLn-1 are arranged to intersect the plurality of word lines WL0 to WLm-1.

On the regions at which the bit lines BL0 to BLn-1 and the word lines WL0 to WLm-1 intersect each other, respective memory cell transistors MC are defined. On the regions at which the bit lines BL0 to BLn-1 intersect the string selection line SSL and the ground selection line GSL, string selection transistors SST and ground selection transistors GST are defined, respectively. A single string selection transistor SST, a plurality of memory cell transistors MC, and a single ground selection transistor GST are connected in series, thus forming a single string S. The strings S formed in each cell block BLK0 to BLK1-1 are connected in parallel with respective bit lines BL. That is, the drain of the string selection transistor SST of each string S is connected to the bit line BL. The source of the ground selection transistor GST is connected to the common source line CSL.

Page buffers P/B are arranged in the upper and lower portions of a peripheral circuit region B, and row decoders R/D are arranged in left and right portions of the peripheral circuit region B.

Figure 4:
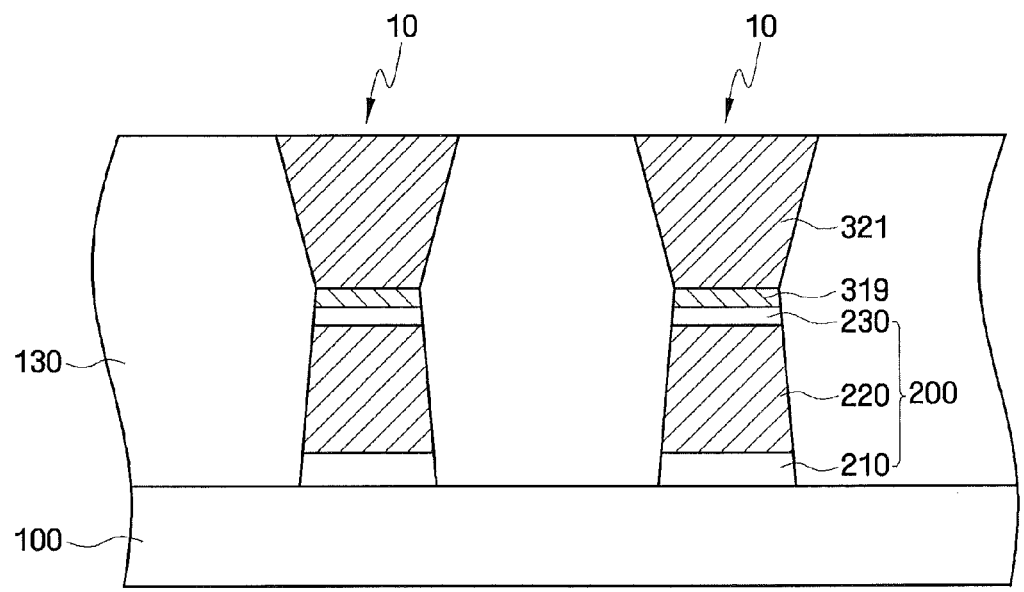
FIG. 4 is a sectional view of a non-volatile memory device according to some embodiments, taken along the line I-I' of FIG. 3.

FIG. 4 is a sectional view of a non-volatile memory device according to some embodiments, taken along the line I-I' of FIG. 3.

Referring to FIGS. 2 to 4, the cell array region A and the peripheral circuit region B are defined by a shallow trench device isolation region formed in a substrate 100. A plurality of active regions AR may be repeatedly arranged in the cell array region A. The substrate 100 can be made of one or more semiconductor materials, such as, for example, silicon (Si), germanium (Ge), silicon germanium (SiGe), gallium phosphide (GaP), gallium arsenide (GaAs), silicon carbide (SiC), silicon germanium carbide (SiGeC), indium arsenide (InAs) and indium phosphide (InP), but is not limited to the above materials. Further, a Silicon-On-Insulator (SOI) substrate can be used as the substrate 100. Further, a plurality of wells (not shown) can be formed in the substrate 100 so as to optimize the characteristics of transistors formed both in the cell array region A and in the peripheral circuit region B. For example, a pocket p-type well is formed in the cell array region, and an n-type well and a p-type well can be separately formed in the peripheral circuit region.

A plurality of stacked gate structures 10 are formed in the cell array region A. Each of the stacked gate structures 10 may correspond to the gate of a memory cell transistor MC. Meanwhile, in addition to the memory cell transistor MC, a string selection transistor SST or a ground selection transistor GST may also be formed in the cell array region A. Further, a driving transistor may be formed in the peripheral circuit region B.

Each of the plurality of stacked gate structures 10 may have a structure in which a lower structure 200, a conductive pattern 319 and a damascene metal silicide pattern 321 are sequentially stacked. A dual-layer of the conductive pattern 319 and the damascene metal silicide pattern 321 formed in the cell array region A corresponds to the word line (WL0 to WLm-1 of FIG. 3) that extends in one direction.

The lower structure 200 of each of the plurality of stacked gate structures 10 may have a structure in which a first dielectric layer pattern 210, a charge storage layer pattern 220, and a second dielectric layer pattern 230 are sequentially stacked, and thus the charge storage layer pattern 220 and the conductive pattern 319 are electrically insulated by the second dielectric layer pattern 230.

The first dielectric layer pattern 210 of the stacked gate structure 10 may be a single layer or a composite layer which is made of at least one material suitable for the tunneling of electrons, for example, silicon dioxide ($SiO_2$), hafnium oxide ($Hf_xO_y$), aluminum oxide ($Al_xO_y$), zirconium oxide ($Zr_xO_y$), tantalum oxide ($Ta_xO_y$), hafnium silicate ($Hf_xSi_{1-x}O_y$) and hafnium silicon oxynitride ($Hf_xSi_{1-x}O_yN_z$). However, the material of the first dielectric layer pattern 210 is not limited to the above examples.

The charge storage layer pattern 220 of the stacked gate structure 10 is a region in which electrons tunneling through the first dielectric layer 210 are stored. When a target non-volatile memory integrated circuit device to be fabricated is a floating gate device, the charge storage layer pattern 220 can be made of, for example, polysilicon doped with impurities. In contrast, when a target non-volatile memory integrated circuit device to be formed is a floating trap-type device, such as, for example, Metal Oxide Nitride Oxide Semiconductor (MONOS) or Silicon Oxide Nitride Oxide Semiconductor (SONOS), the charge storage layer pattern 220 can be made of a material in which electrons can be trapped, for example, silicon nitride (SiN), etc. In the case of the floating trap-type device, the charge storage layer pattern 220 is non-conductive, and can be formed to be at a different position (e.g., lower) than shown in FIG. 4. In other words, the charge storage layer pattern 220 may include, for example, at least one of silicon nitride ($Si_3N_4$), nano crystalline silicon, nano crystalline silicon germanium, nano crystalline metal, aluminum oxide ($Al_2O_3$), hafnium oxide ($HfO_2$), hafnium aluminum oxide (HfAlO) and hafnium silicon oxynitride (HfSiON).

The second dielectric layer pattern 230 of the stacked gate structure 10 is an inter-gate dielectric, and prohibits charges stored in the charge storage layer pattern 220 from moving to the conductive pattern 319 or the damascene metal silicide pattern 321. For example, the second dielectric layer pattern 230 may be a single layer or a composite layer made of at least one of materials such as oxide/nitride oxide (ONO), silicon dioxide ($SiO_2$), hafnium oxide ($Hf_xO_y$), aluminum oxide ($Al_xO_y$), zirconium oxide ($Zr_xO_y$), tantalum oxide ($Ta_xO_y$), hafnium silicate ($Hf_xSi_{1-x}O_y$) and hafnium silicon oxynitride ($Hf_xSi_{1-x}O_yN_z$), but is not limited to the above materials.

The conductive pattern 319 can be, for example, a polysilicon layer. The conductive pattern 319 may reinforce adhesion between the second dielectric layer pattern 230 and the damascene metal silicide pattern 321. Accordingly, the reliability of the nonvolatile memory device can be improved.

The damascene metal silicide pattern 321 may include at least one metal silicide, such as cobalt silicide, tungsten silicide, molybdenum silicide, titanium silicide and tantalum silicide.

Figure 5:
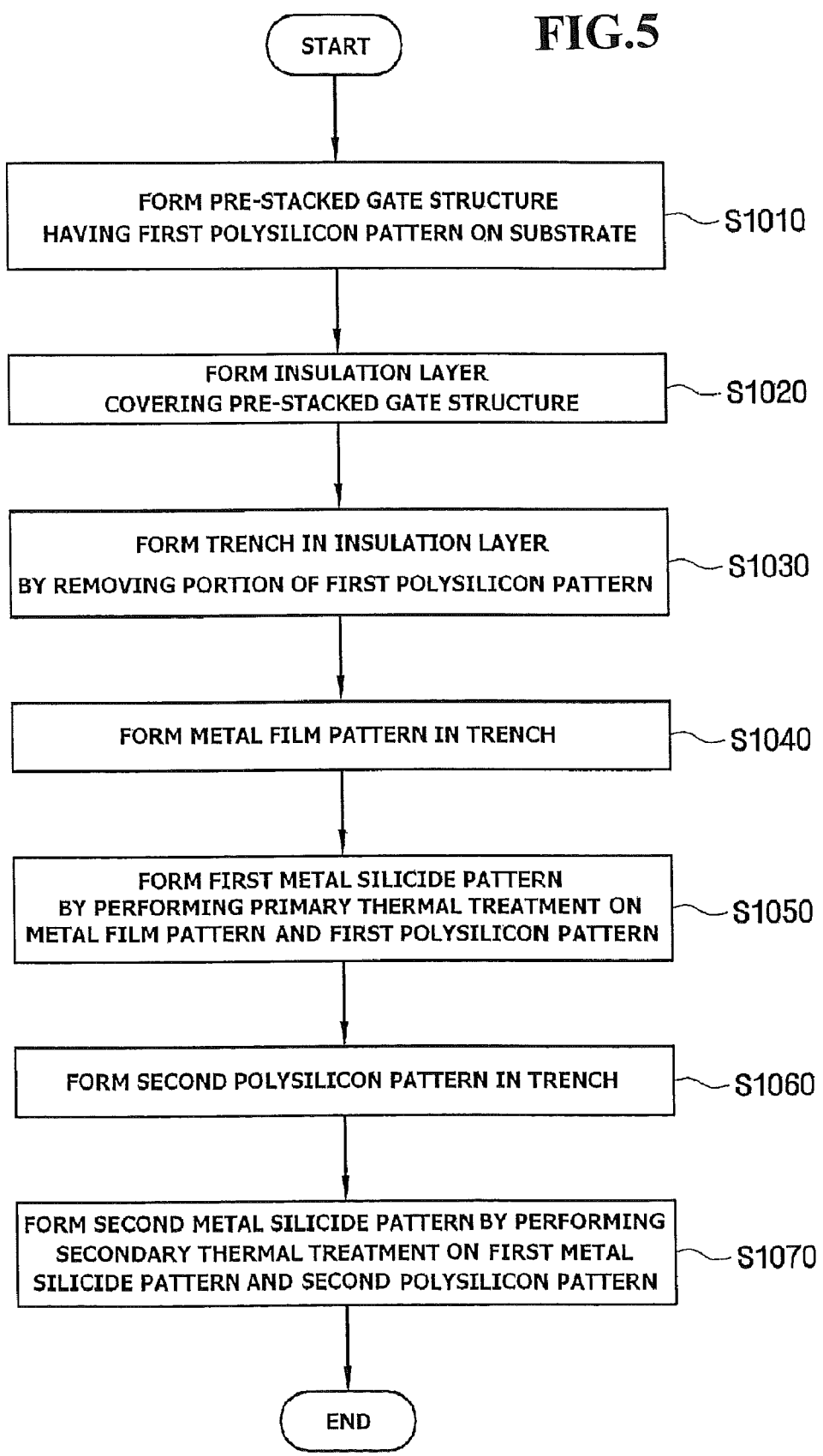
FIG. 5 is a flow chart showing a method of fabricating a nonvolatile memory device according to some embodiments.

FIG. 5 is a flow chart showing a fabricating method of a nonvolatile memory device according to some embodiments, and FIGS. 6 to 13 are sectional views showing process steps of a fabricating method of a nonvolatile memory device according to some embodiments. For brevity, the same reference numerals are used to designate components substantially similar to those of FIG. 4, and a detailed description of the substantially similar components may be omitted.

Figure 6:
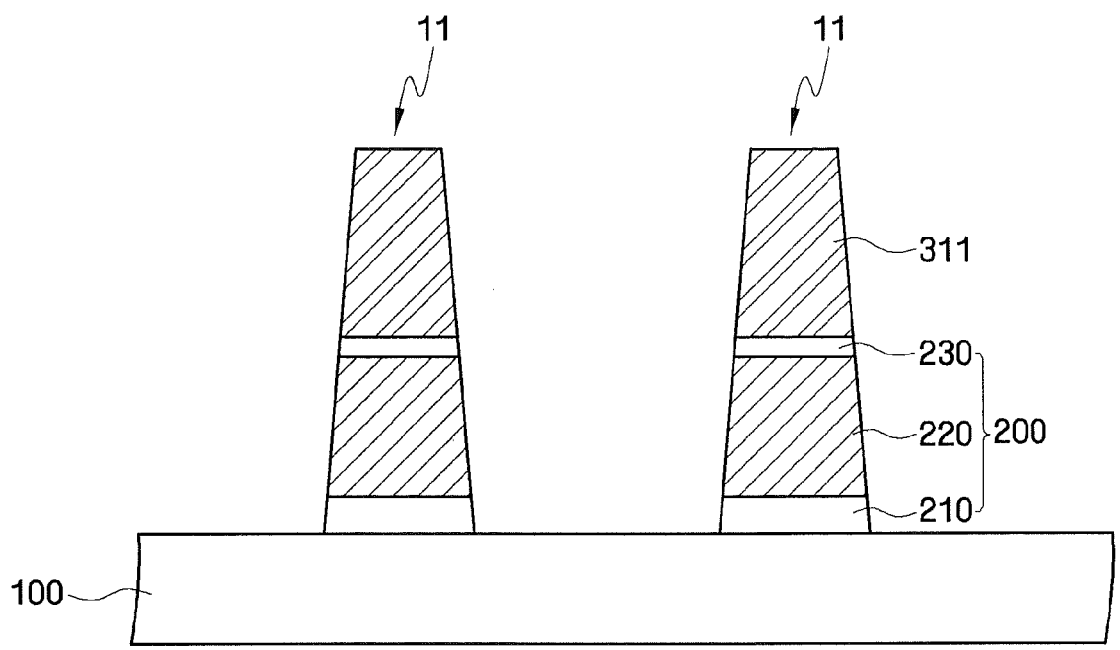
FIGS. 6 to 13 are sectional views showing process blocks of a fabricating method of a nonvolatile memory device according to some embodiments.

First, referring to FIGS. 5 and 6, a substrate 100 is provided. Then, a pre-stacked gate structure 11 including a lower structure 200 and a first polysilicon pattern 311 is formed on the substrate 100 (Block S1010).

The pre-stacked gate structure 11 has a structure in which the lower structure 200 and the first polysilicon pattern 311 are sequentially stacked. The lower structure 200 has a structure in which a first dielectric layer pattern 210, a charge storage layer pattern 220, and a second dielectric layer pattern 230 are sequentially stacked.

The lower structure 200 is formed by stacking a material for forming the first dielectric layer pattern 210 on the substrate 100 using, for example, a chemical vapor deposition (CVD) process, to form a layer (not shown) for forming the first dielectric layer pattern 210. The material for forming the first dielectric layer pattern 210 may include, for example, $Hf_xSi_{1-x}O_y$, but is not limited thereto.

Next, a material for forming the charge storage layer pattern 220 is stacked on the layer for forming the first dielectric layer pattern 210 using, for example, a chemical vapor deposition (CVD) process, to form a layer (not shown) for forming the charge storage layer pattern 220. The material for forming the charge storage layer pattern 220 may include, for example, polysilicon, but is not limited thereto.

Next, a material for forming the second dielectric layer pattern 230 is stacked on the layer (not shown) for fowling the charge storage layer pattern 220 using, for example, a chemical vapor deposition (CVD) process, to form a layer (not shown) for forming the second dielectric layer pattern 230. The material for forming the second dielectric layer pattern 230 may include, for example, oxide/nitride/oxide (ONO), but is not limited thereto.

Next, a polysilicon material is stacked on the layer for forming the second dielectric layer pattern 230 using, for example, a chemical vapor deposition (CVD) process, to form a first polysilicon layer (not shown).

Next, the pre-stacked gate structure 11 including the lower structure 200 and the first polysilicon pattern 311 is formed by a photolithography process that collectively etches the layer for forming the first dielectric layer pattern 210, the layer for forming the charge storage layer pattern 220, the layer for forming the second dielectric layer pattern 230, and the first polysilicon layer. A plurality of the pre-stacked gate structures 11 may be formed in the cell array region A.

Next, impurities are implanted and thus junction regions (not shown) may be formed in the cell array region A, which is exposed by the pre-stacked gate structure 11.

Spacers (not shown) may be formed on sidewalls of the pre-stacked gate structure 11. Specifically, a material for spacers, such as an oxide film or a nitride film, is applied on the pre-stacked gate structure 11, and is then etched back, thereby forming the spacers.

Figure 7:
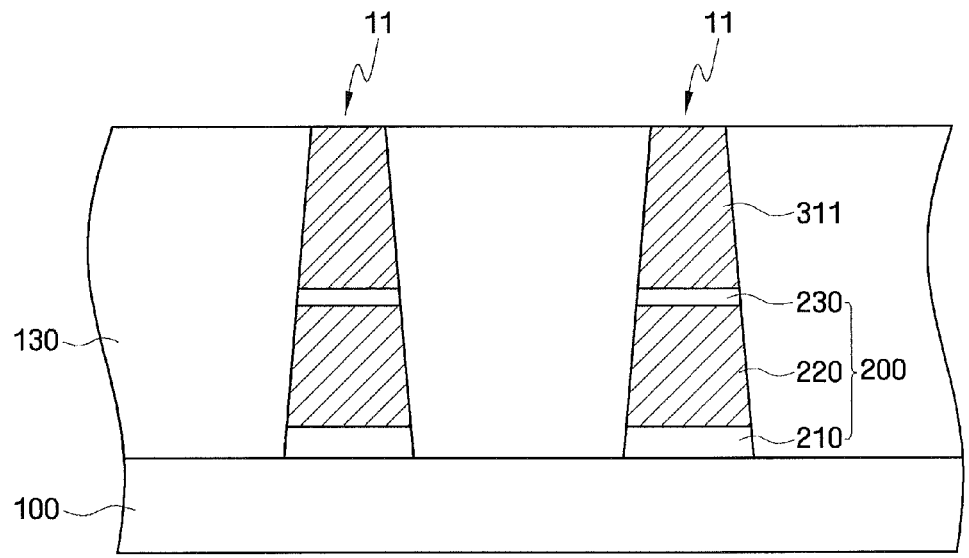

Next, referring to FIGS. 5 and 7, an insulation layer 130 covering the pre-stacked gate structure 11 is formed (Block S1020). The insulation layer 130 may be made of an inorganic insulating material or an organic insulating material. The insulation layer 130 may be made of an insulating material such as silicon nitride ($SiN_x$) or silicon oxide ($SiO_x$). In addition, the insulation layer 130 may be made of an insulating material such as novolak-based i-line resist, polyvinyl phenol (PVP)-based krypton fluoride (KrF) resist, polyhydroxy styrene (PHS)-based KrF resist, methylacrylate-based argon fluoride (ArF) resist, or an amorphous carbon layer (ACL).

The insulation layer 130 can be formed in the following manner. For example, silicon oxide ($SiO_x$) may be stacked on the substrate 100 including the pre-stacked gate structure 11 by a chemical vapor deposition (CVD) process. The insulation layer 130 may be formed such that a plurality of the pre-stacked gate structure 11 are covered by silicon oxide ($SiO_x$). Alternatively or additionally, the insulation layer 130 may be formed such that silicon oxide ($SiO_x$) is filled between each of the plurality of the pre-stacked gate structure 11.

Next, the insulation layer 130 is planarized to expose the surface of the pre-stacked gate structure 11. The planarization can be performed using, for example, a chemical mechanical polishing (CMP) process or an etch back process. Accordingly, the top surface of the first polysilicon pattern 311 of the pre-stacked gate structure 11 can be exposed.

Figure 8:
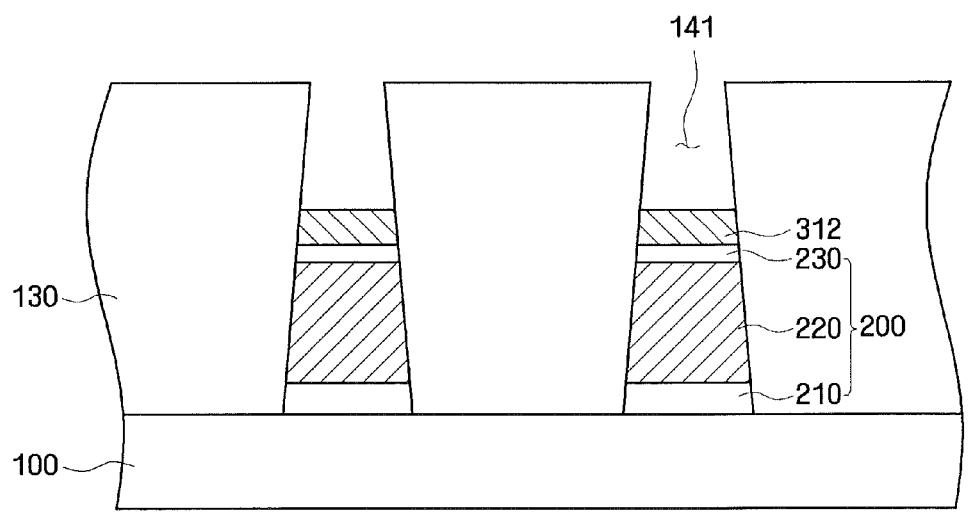
Figure 9:
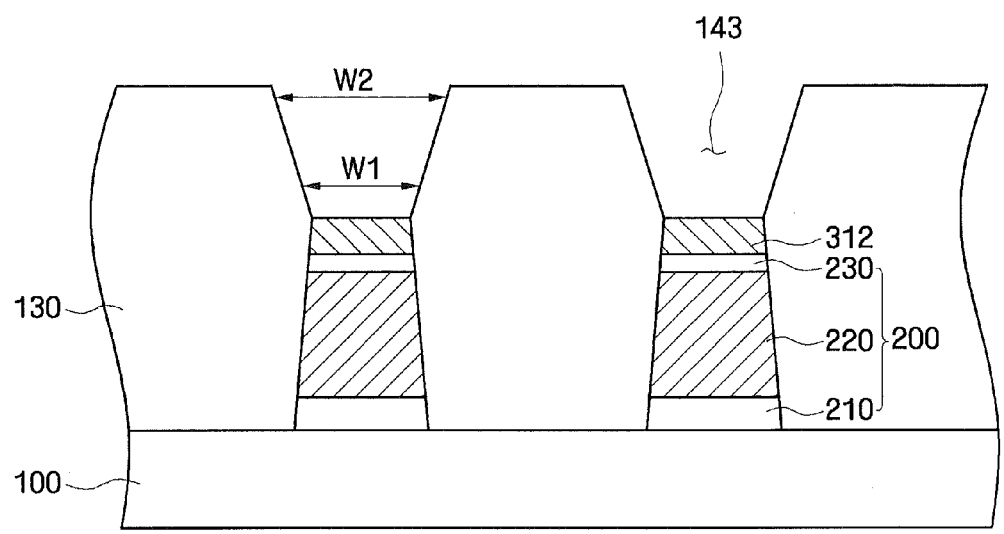

Next, referring to FIGS. 5, 8 and 9, a portion of the first polysilicon pattern 311 of the pre-stacked gate structure 11 may be removed to form a trench 141 in the insulation layer 130 (Block S1030). The portion of the first polysilicon pattern 311 may be removed by, for example, dry etching. In the following description, reference numeral '312' denotes a remaining/partially-removed first polysilicon pattern.

Meanwhile, the trench 141 may extend in a direction parallel to a direction in which the pre-stacked gate structure 11 extends in the cell array region. Sidewalls of the trench 141 may be defined by part of the insulation layer 130, and the bottom surface of the trench 141 may be defined by part of the remaining/partially-removed first polysilicon pattern 312. A first and/or a second metal silicide pattern may be formed in a subsequent process in the trench 141. The first and/or the second metal silicide pattern in the trench 141 may form a word line of the stacked gate structure 10.

Referring to FIG. 8, the trench 141 from which the first polysilicon pattern 311 is removed may become gradually narrower toward the top surface of the insulation layer 130. Accordingly, a second polysilicon pattern filled in the trench 141 in a subsequent process may have a width that decreases toward the top surface of the insulation layer 130.

In addition, a second metal silicide pattern may be formed of the second polysilicon pattern in a subsequent process and may also have a width that decreases toward the top surface of the insulation layer 130.

Referring to FIG. 9, in order to reduce resistance of a word line by increasing an area of the second metal silicide pattern (see '321' of FIG. 4) to be formed in the trench 143, the width of the trench 141 shown in FIG. 8 may be partly changed. In other words, at least a portion of the insulation layer 130 forming the sidewalls of the trench 141 shown in FIG. 8 may be removed, thereby forming a trench 143 shown in FIG. 9. The trench 143 shown in FIG. 9 may have a width that increases toward the top surface of the insulation layer 130 and that decreases toward a surface of the substrate 100. For example, a width W2 of the top portion of the trench 143 is greater than a width W1 around the bottom surface of the trench 143.

A second polysilicon pattern (see '163' of FIG. 13) to be filled in the trench 143 may have a width increasing toward the top surface of the insulation layer 130. In addition, a second metal silicide pattern 321 to be formed of the second polysilicon pattern 163 in a subsequent process may also have a width increasing toward the top surface of the insulation layer 130.

Meanwhile, since the second metal silicide pattern 321 to be formed in the trench 143 that is shown in FIG. 9 has a greater width than the second metal silicide pattern to be formed in the trench 141 that is shown in FIG. 8, the resistance of the second metal silicide pattern 321 can be reduced. Accordingly, since the second metal silicide pattern 321 forms a word line of the stacked gate structure 10, the resistance of the word line can be reduced as a whole. That is to say, since the RC-delay of the word line is reduced, the reliability of the nonvolatile memory device can be improved.

Figure 10:
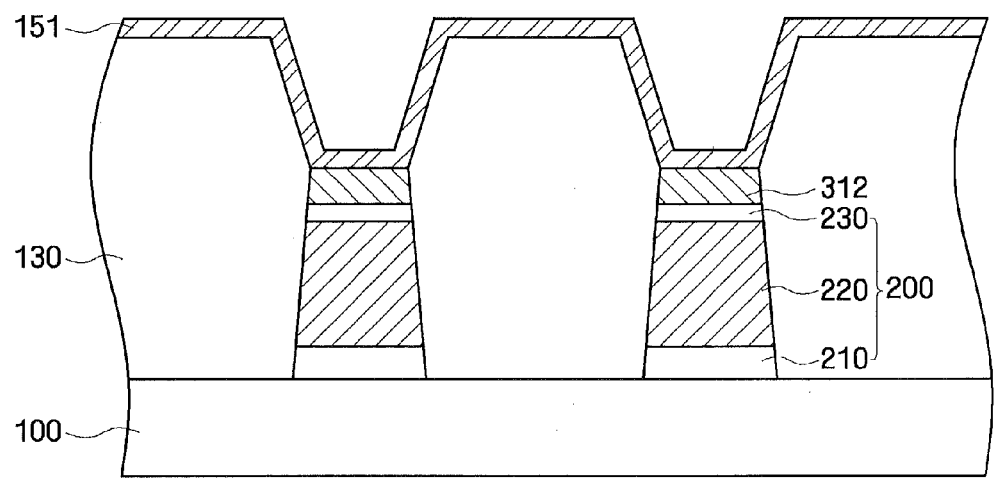

Next, referring to FIGS. 5 and 10, a metal film pattern 151 is formed in the trench 143 (Block S1040). The metal film pattern 151 may be conformally formed in the trench 143. In addition, the metal film pattern 151 may also be formed on the top surface of the insulation layer 130. In other words, the metal film pattern 151 may be conformally formed on the entire top surface of the resultant structure shown in FIG. 9.

Since the metal film pattern 151 may be conformally formed in the trench, it may be formed on the sidewalls and bottom surface of the trench 143. In other words, the metal film pattern 151 may be formed on the first polysilicon pattern 312 defining the bottom surface of the trench 143. Meanwhile, the metal film pattern 151 can be fowled through, for example, chemical vapor deposition (CVD) or atomic layer deposition (ALD). The metal film pattern 151 may include at least one metal such as cobalt (Co), tungsten (W), molybdenum (Mo), titanium (Ti), and tantalum (Ta).

Figure 11:
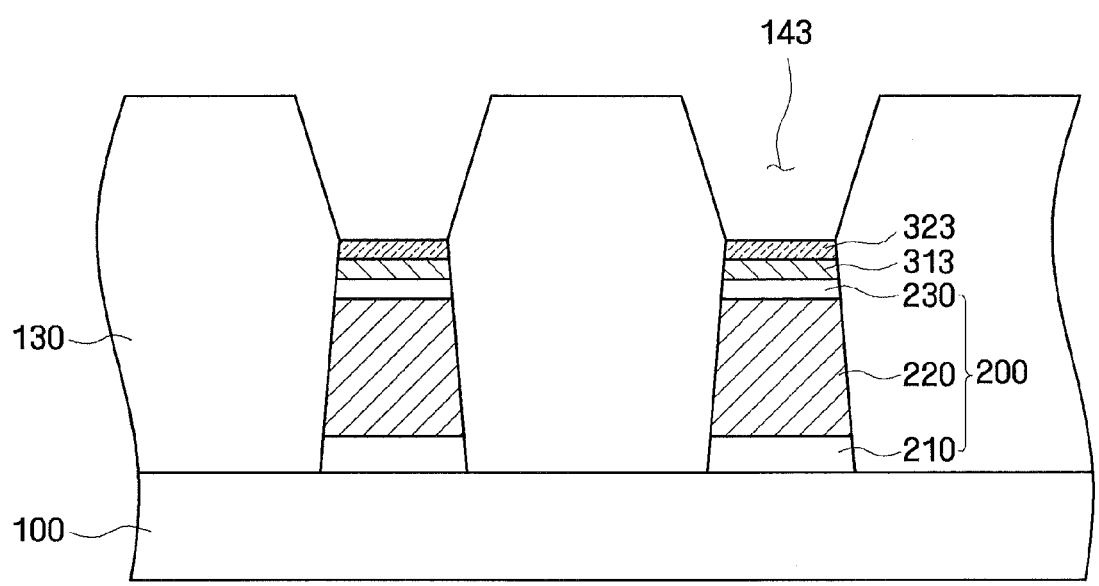

Next, referring to FIGS. 5 and 11, a first metal silicide pattern 323 is formed by performing a first/primary thermal treatment on the first polysilicon pattern 312 and the metal film pattern 151 (Block S1050). For example, the first/primary thermal treatment may be performed under a nitrogen gas ($N_2$) atmosphere at a temperature in a range of about 500° C. to about 600° C.

The primary thermal treatment allows polysilicon included in the first polysilicon pattern 312 and a metallic material included in the metal film pattern 151 to be bonded with each other to form the first metal silicide pattern 323. The polysilicon and the metallic material may be bonded with each other in a ratio of about 1:1. For example, when the metal film pattern 151 includes cobalt (Co), the metallic material may be cobalt (Co). Meanwhile, since the polysilicon includes silicon (Si), cobalt (Co) and silicon (Si) are bonded to each other by the primary thermal treatment, thereby forming first cobalt silicide (CoSi). Cobalt (Co) and silicon (Si) are bonded in an amount ratio of about 1:1.

When the metal film pattern 151 includes at least one metal such as cobalt (Co), tungsten (W), molybdenum (Mo), titanium (Ti) and tantalum (Ta), the first metal silicide pattern 323 may include at least one metal silicide such as cobalt silicide (CoSi), tungsten silicide (WSi), molybdenum silicide (MoSi), titanium silicide (TiSi), and tantalum silicide (TaSi).

Next, after the primary thermal treatment, part of the metal film pattern 151 that is not bonded with the polysilicon of the first polysilicon pattern 312 is removed. For example, the portions of the metal film pattern 151 positioned on the sidewalls of the trench 143 and the portions of the metal film pattern 151 positioned on the insulation layer 130 may be removed.

Reference numeral 313 denotes a remaining portion of the first polysilicon pattern that is not bonded with a metallic material of the metal film pattern 151.

Figure 12:
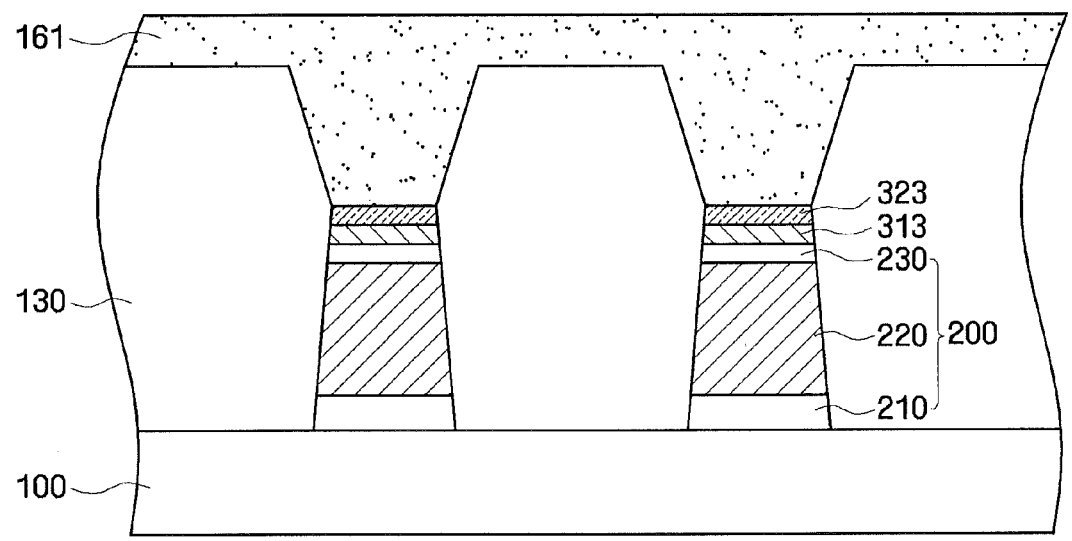
Figure 13:
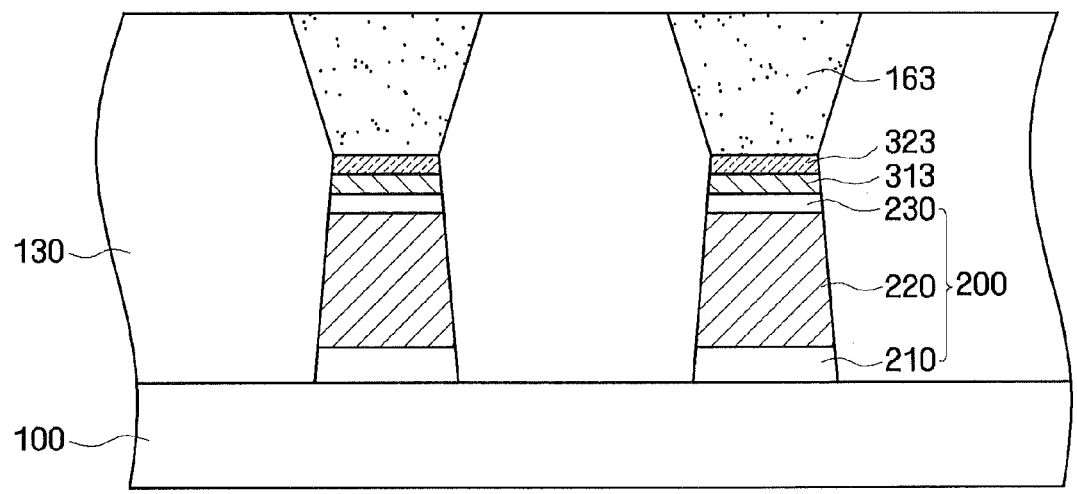

Referring to FIGS. 5, 12 and 13, a polysilicon layer 161 is formed on the resultant structure shown in FIG. 11. As a result, as shown in FIG. 12, the polysilicon layer 161 is formed on the insulation layer 130 to fill the trench 143.

Thereafter, a portion of the polysilicon layer 161 may be removed to expose a top surface of the insulation layer 130. For example, the polysilicon layer 161 may be planarized. Accordingly, a damascene second polysilicon pattern 163 is formed in the trench 143 (Block S1060). Nodes may be separated between the plurality of pre-stacked gate structures 11, thereby insulating the plurality of pre-stacked gate structures 11 from each other. The planarization can be performed using, for example, a chemical mechanical polishing (CMP) process or an etch back process.

Referring to FIGS. 4, 5, and 13, the second metal silicide pattern 321 is formed by performing a second/secondary thermal treatment on the second polysilicon pattern 163 and the first metal silicide pattern 323 (Block S1070). The remaining portion of the first polysilicon pattern 313 may also react with the first metal silicide pattern 323, during the formation of the second metal silicide pattern 321.

Meanwhile, the secondary thermal treatment may be performed under a nitrogen gas ($N_2$) atmosphere at a temperature in a range of about 700° C. to about 900° C.

The secondary thermal treatment allows polysilicon included in the first and second polysilicon patterns 313 and 163 and a metallic material included in the first metal silicide pattern 323 to be bonded with each other to form the second metal silicide pattern 321. The polysilicon and the metallic material may be bonded with each other in a ratio of about 1:1. For example, when the first metal silicide pattern 323 includes primary cobalt silicide (CoSi), the metallic silicide material may be primary cobalt silicide (CoSi). Meanwhile, since the first and second polysilicon patterns 313 and 163 include silicon (Si), primary cobalt silicide (CoSi) and silicon (Si) are bonded to each other by the secondary thermal treatment, thereby forming secondary cobalt silicide ($CoSi_2$). Primary cobalt silicide (CoSi) and silicon (Si) may be bonded in an amount ratio of about 1:1.

Meanwhile, if the first metal silicide pattern 323 includes at least one metal silicide such as primary cobalt silicide (CoSi), primary tungsten silicide (WSi), primary molybdenum silicide (MoSi), primary titanium silicide (TiSi) and primary tantalum silicide (TaSi), the second metal silicide pattern 321 may include at least one metal silicide such as secondary cobalt silicide ($CoSi_2$), secondary tungsten silicide ($WSi_2$), secondary molybdenum silicide ($MoSi_2$), secondary titanium silicide ($TiSi_2$), and secondary tantalum silicide ($TaSi_2$).

After forming the second metal silicide pattern 321, a portion of the remaining first polysilicon pattern 313 remains to then be formed as a conductive pattern 319. In other words, the conductive pattern 319 may be a polysilicon layer pattern positioned between the second metal silicide pattern 321 and the lower structure 200.

As a result of forming the second metal silicide pattern 321, a plurality of stacked gate structures 10 having word lines including the second metal silicide pattern 321 and the conductive pattern 319 are formed.

In a nonvolatile memory device according to some embodiments, an area of the second metal silicide pattern 321 can be increased, thereby reducing the resistance of the word line.

In addition, according to some embodiments, the second metal silicide pattern 321 is formed to have a damascene structure, thereby reducing/preventing a necking phenomenon when the second metal silicide pattern 321 is formed. The necking phenomenon means that an area of the metal silicide pattern is partially reduced when the metal silicide pattern is formed. In a case where the area of the metal silicide pattern is reduced due to the necking phenomenon, the resistance of the metal silicide pattern may increase. However, according to some embodiments, the necking phenomenon can be reduced/prevented, thereby reducing/preventing an increase in the resistance of the second metal silicide pattern 321.

According to some embodiments, the resistance of the word line can be reduced as a whole and the Resistance-Capacitance (RC) delay of the word line can be reduced accordingly, and the nonvolatile memory device may thereby be fabricated to have improved reliability.

Figure 14:
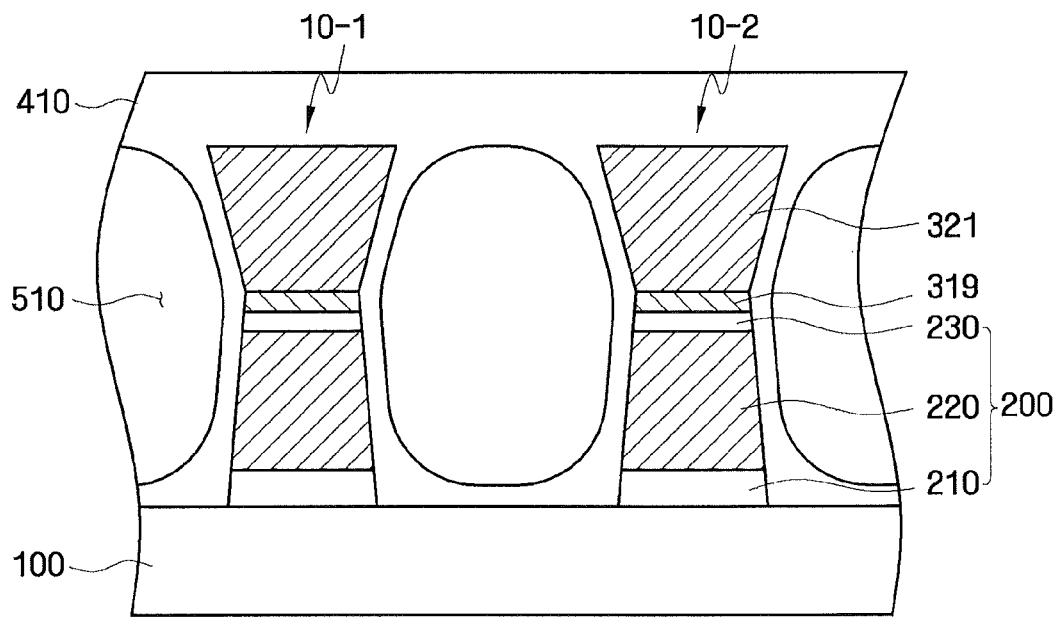
FIG. 14 is a sectional view of a non-volatile memory device according to some embodiments, taken along the line I-I' of FIG. 3.
Figure 15:
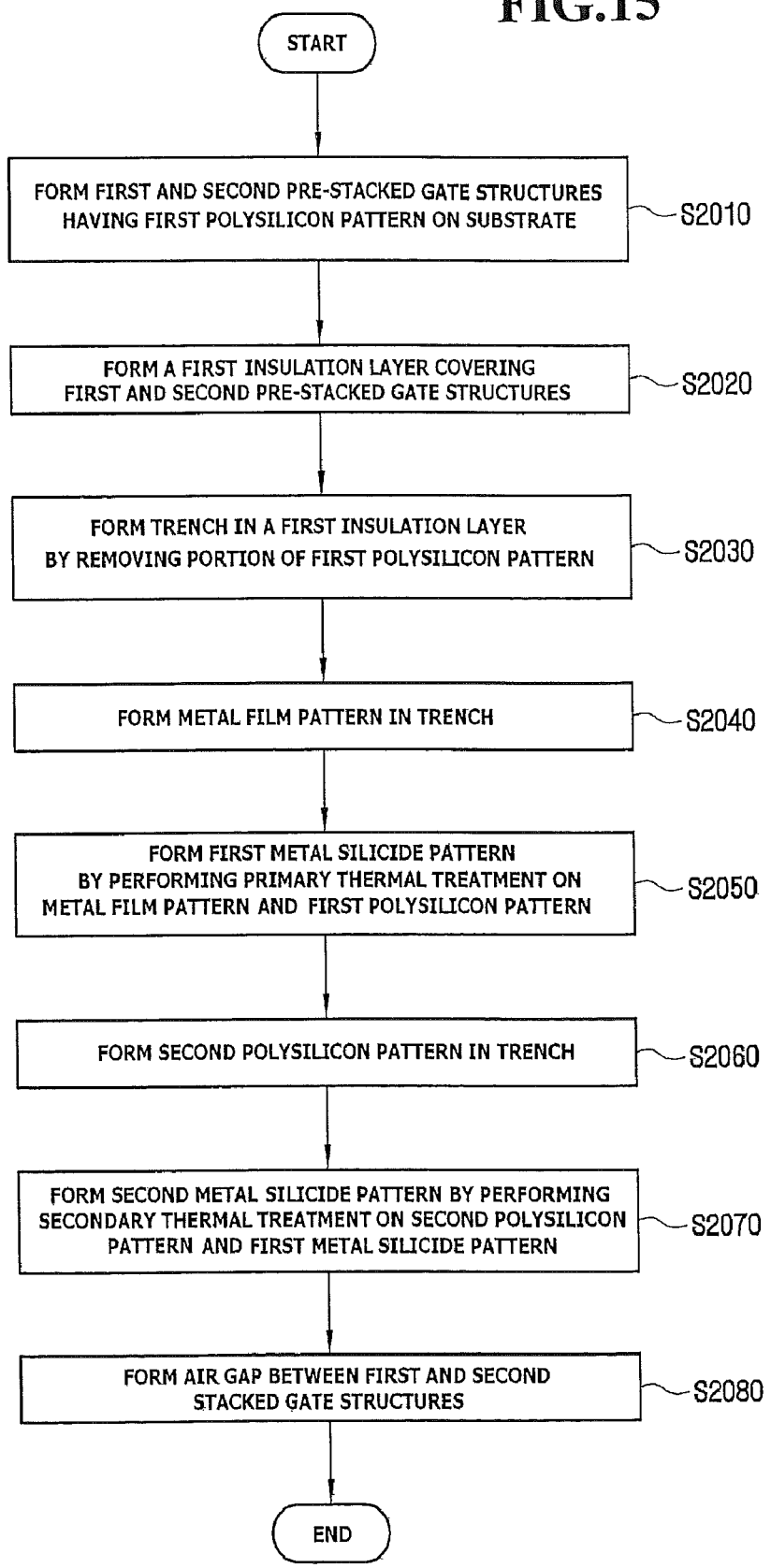
FIG. 15 is a flow chart showing a method of fabricating a nonvolatile memory device according to some embodiments.
Figure 16:
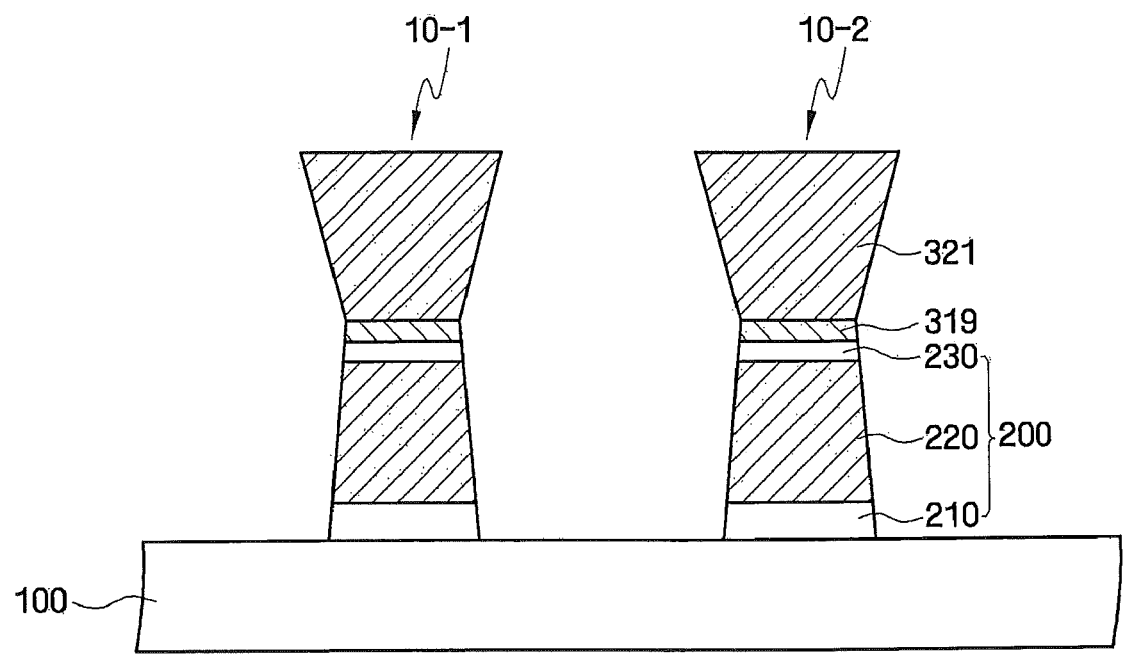
FIGS. 16 and 17 are sectional views showing process blocks of a method of fabricating a nonvolatile memory device according to some embodiments.
Figure 17:
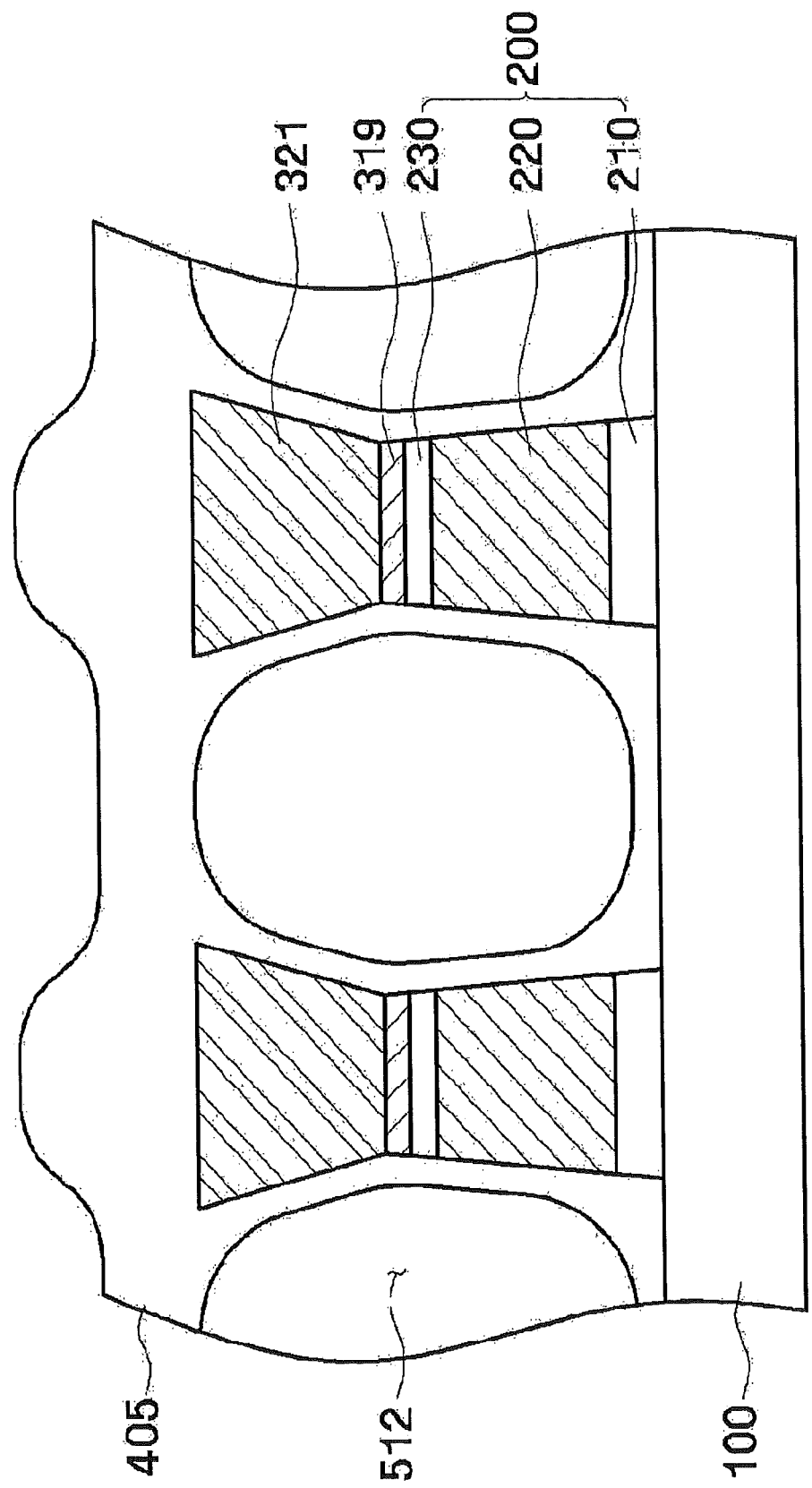

FIG. 14 is a sectional view of a non-volatile memory device according to some embodiments, taken along the line I-I' of FIG. 3. FIG. 15 is a flow chart showing a fabricating method of a nonvolatile memory device according to some embodiments, and FIGS. 16 and 17 are sectional views showing a fabricating method of a nonvolatile memory device according to some embodiments. For brevity, the same reference numerals are used to designate components substantially similar to those of previous Figures, and a detailed description of the components may be omitted.

Referring to FIG. 14, the memory device according to some embodiments may be substantially similar to the memory device shown in FIG. 4, except that a void/air gap 510 is formed between stacked gate structures 10-1 and 10-2.

Meanwhile, reference numerals '10-1' and '10-2' denote stacked gate structures of memory cell transistors MC in a cell array region. Specifically, for convenience of explanation, reference numeral 10-1 may be referred to as a first stacked gate structure, and reference numeral 10-2 may be referred to as a second stacked gate structure.

In processing blocks shown in FIG. 15, since Blocks S2010 to S2070 may be substantially similar to Blocks S1010 to S1070 of FIG. 5, repeated explanations thereof may be omitted.

Referring to FIGS. 15 and 16, the insulation layer 130 positioned between the first stacked gate structure 10-1 and the second stacked gate structure 10-2 is removed from the resultant structure shown in FIG. 4. For convenience of explanation, the insulation layer 130 may be referred to as a first insulation layer 130. Removing the first insulation layer 130 may be performed by dry etching.

Referring to FIGS. 15 and 17, a layer 405 for forming a second insulation layer 410 is formed to cover sidewalls and top surfaces of the first and second stacked gates 10-1 and 10-2. The second insulation layer forming layer 405, although covering the sidewalls and top surfaces of the first and second stacked gates 10-1 and 10-2, is not formed in a space 512 between the first and second stacked gates 10-1 and 10-2. In other words, the space 512 between the first and second stacked gates 10-1 and 10-2 is free of the second insulation layer forming layer 405. However, the second insulation layer forming layer 405 may be formed to surround the space 512, which is to be finally formed as a void/air gap 510.

The second insulation layer forming layer 405 may be made of an inorganic insulating material or an organic insulating material. For example, the insulation layer 130 may be made of an inorganic insulating material such as silicon nitride ($SiN_x$) or silicon oxide ($SiO_x$). In addition, the insulation layer 130 may be made of an insulating material such as novolak-based i-line resist, polyvinyl phenol (PVP)-based KrF resist, polyhydroxy styrene (PHS)-based KrF resist, methylacrylate-based ArF resist, or an amorphous carbon layer (ACL).

Referring to FIGS. 14, 15 and 17, the second insulation layer forming layer 405 (FIG. 17) is planarized to form the air gap 510 between the second insulation layer 410 (FIG. 14) and each of the first and second stacked gates 10-1 and 10-2 (FIG. 15, Block S2080). The planarization can be performed using a chemical mechanical polishing (CMP) process or an etch back process, but is not limited thereto.

The second insulation layer forming layer 405 may be formed to cover the sidewalls and top surfaces of the first and second stacked gates 10-1 and 10-2. In addition, the second insulation layer forming layer 405 is not formed in the space 512 between the first and second stacked gates 10-1 and 10-2. The space 512 corresponds to the void/air gap 510 between the first and second stacked gates 10-1 and 10-2. Meanwhile, the second insulation layer forming layer 405 may be formed to surround the space 512, which is to be finally formed as a void/air gap 510.

Although air gaps have been discussed herein by way of example, any gap may be used according to embodiments of the present disclosure. A gap may be defined, for example, as any void or cavity, and may be a gap filled with air (e.g., an air gap), a gap filled with an inert gas or gases (e.g., an inert gas gap), a gap defining a vacuum (e.g., a vacuum gap), etc.

In the nonvolatile memory device according to some embodiments, an area of the second metal silicide pattern 321 can be increased, thereby reducing the resistance of the word line as a whole. That is to say, the resistance of the word line can be reduced as a whole and the Resistance-Capacitance (RC) delay of the word line can be reduced accordingly, and the nonvolatile memory device may thereby be fabricated to have improved reliability.

In addition, according to some embodiments, the void/air gap 510 having relatively low dielectric constant may be formed between the first and second stacked gates 10-1 and 10-2, thereby reducing/preventing a parasitic capacitance from being generated between the first and second stacked gates 10-1 and 10-2.

While the inventive concept has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A method of fabricating a memory device comprising:
   forming a pre-stacked gate structure on a substrate, the pre-stacked gate structure including a lower structure and a first polysilicon pattern on the lower structure;
   forming an insulation layer covering the pre-stacked gate structure;
   forming a trench in the insulation layer by removing a portion of the first polysilicon pattern;
   forming a metal film pattern in the trench on the partially-removed first polysilicon pattern;
   forming a first metal silicide pattern by performing a first thermal treatment on the partially-removed first polysilicon pattern and the metal film pattern;
   forming a second polysilicon pattern in the trench; and
   forming a second metal silicide pattern by performing a second thermal treatment on the second polysilicon pattern and the first metal silicide pattern.

2. The method of claim 1, wherein forming the second polysilicon pattern comprises:
   forming a polysilicon layer on the insulation layer and filling the trench; and
   removing a portion of the polysilicon layer to expose a top surface of the insulation layer.

3. The method of claim 1, wherein the lower structure includes a first dielectric layer pattern, a charge storage layer pattern, and a second dielectric layer pattern that are sequentially stacked.

4. The method of claim 1, wherein forming the trench comprises removing a portion of the insulation layer such that a width of the trench increases toward a top surface of the insulation layer.

5. The method of claim 4, wherein a width of the second polysilicon pattern increases toward the top surface of the insulation layer.

6. The method of claim 1, wherein the metal film pattern is conformally formed on an inner wall of the trench and on the partially-removed first polysilicon pattern and the insulation layer.

7. The method of claim 6, further comprising, after the first thermal treatment, substantially removing the insulation layer and portions of the metal film pattern remaining on the inner wall of the trench.

8. The method of claim 1, wherein the metal film pattern includes at least one of cobalt (Co), tungsten (W), molybdenum (Mo), titanium (Ti), and tantalum (Ta).

9. The method of claim 8, wherein the first metal silicide pattern includes at least one of cobalt silicide (CoSi), tungsten silicide (WSi), molybdenum silicide (MoSi), titanium silicide (TiSi), and tantalum silicide (TaSi).

10. The method of claim 1, further comprising forming a polysilicon pattern between the second metal silicide pattern and the lower structure.

11. A method of fabricating a memory device comprising:
forming first and second pre-stacked gate structures on a substrate, each of the first and second pre-stacked gate structures including a lower structure and a first polysilicon pattern on the lower structure;
forming a first insulation layer covering the first and second pre-stacked gate structures;
forming a trench in the first insulation layer by removing a portion of the first polysilicon pattern;
forming a metal film pattern in the trench on the first polysilicon pattern;
forming a first metal silicide pattern by performing a first thermal treatment on the first polysilicon pattern and the metal film pattern;
forming a second polysilicon pattern in the trench;
forming first and second stacked gate structures by forming a second metal silicide pattern by performing a second thermal treatment on the second polysilicon pattern and the first metal silicide pattern; and
forming a gap between the first and second stacked gate structures.

12. The method of claim 11, wherein forming the gap comprises substantially removing the first insulation layer between the first and second stacked gate structures.

13. The method of claim 12, further comprising, after substantially removing the first insulation layer, forming a second insulation layer covering sidewalls of the first and second stacked gate structures.

14. The method of claim 13, wherein the gap between the first and second stacked gate structures is free of the second insulation layer.

15. The method of claim 14, wherein the second insulation layer surrounds the gap.

16. A method of forming a memory device comprising:
forming a first polysilicon pattern on a charge storage pattern and at least one dielectric pattern;
forming an insulation layer on sidewalls of the first polysilicon pattern, the charge storage pattern, and the at least one dielectric pattern;
forming a trench in the insulation layer by removing a portion of the first polysilicon pattern;
forming a metal film pattern in the trench on the partially-removed first polysilicon pattern;
forming a first metal silicide pattern by performing a first thermal treatment on the partially-removed first polysilicon pattern and the metal film pattern;
forming a second polysilicon pattern on the first metal silicide pattern in the trench; and
forming a second metal silicide pattern by performing a second thermal treatment on the second polysilicon pattern and the first metal silicide pattern.

17. The method of claim 16,
wherein the at least one dielectric pattern comprises two dielectric patterns, and
wherein the charge storage pattern is between the two dielectric patterns.

18. The method of claim 16, wherein a width of the trench increases toward a top surface of the insulation layer.

19. The method of claim 18, wherein a width of the second metal silicide pattern is greater than a width of the first metal silicide pattern.

20. The method of claim 16, further comprising forming a gap between first and second ones of the charge storage patterns, wherein an additional insulation layer is formed between the gap and the first and second ones of the charge storage patterns.

* * * * *